(12) United States Patent
Iizuka

(10) Patent No.: US 8,316,264 B2
(45) Date of Patent: Nov. 20, 2012

(54) FAILURE ANALYSIS METHOD, FAILURE ANALYSIS APPARATUS, AND COMPUTER PROGRAM PRODUCT

(75) Inventor: Yoshikazu Iizuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 12/878,247

(22) Filed: Sep. 9, 2010

(65) Prior Publication Data

US 2011/0154138 A1   Jun. 23, 2011

(30) Foreign Application Priority Data

Dec. 18, 2009   (JP) ................................. 2009-288441

(51) Int. Cl.
*G11C 29/00* (2006.01)
(52) U.S. Cl. ....................................................... 714/718
(58) Field of Classification Search ..................... 714/42, 714/718, 724; 702/117
See application file for complete search history.

(56) References Cited

U.S. PATENT DOCUMENTS 6,009,545 A * 12/1999 Tsutsui et al. ................. 714/718
6,330,693 B1 * 12/2001 Lindsay ........................... 714/42
7,079,971 B2 * 7/2006 Fukuda ......................... 702/117
8,099,639 B2 * 1/2012 Kodama ........................ 714/718

FOREIGN PATENT DOCUMENTS

| JP | 07-153298 | 6/1995 |
| JP | 2001-324546 | 11/2001 |
| JP | 3256555 | 11/2001 |
| JP | 2008-299953 | 12/2008 |
| WO | WO-02/33708 A1 | 4/2002 |

* cited by examiner

*Primary Examiner* — Shelly A Chase
(74) *Attorney, Agent, or Firm* — Finnegan, Henderson, Farabow, Garrett & Dunner, L.L.P.

(57) ABSTRACT

According to one embodiment, electrical test results of a semiconductor memory arrayed in a logical address order are stored in a first memory secured in a main memory, a plurality of second memory areas in each of which loading and storing of each data in a unit size is performed is secured in the main memory, FBMs in which pass/fail information is arrayed in a physical address order are generated based on different parts of the electrical test results stored in the first memory area, respectively, the FBMs generated from the different parts of the electrical test results are stored in the second memory areas, respectively, and the FBMs stored in the second memory areas, respectively, are output.

14 Claims, 11 Drawing Sheets

| INDEX No. | POINTER | NUMBER OF FAIL BITS |
|---|---|---|
| 1 | 0x72000000 | 1 |
| 2 | 0x72000010 | 1 |
| 3 | 0x72000020 | 0 |
| 4 | 0x72000030 | 0 |

FAILURE ANALYSIS METHOD, FAILURE ANALYSIS APPARATUS, AND COMPUTER PROGRAM PRODUCT

CROSS-REFERENCE TO RELATED APPLICATIONS

This application is based upon and claims the benefit of priority from the prior Japanese Patent Application No. 2009-288441, filed on Dec. 18, 2009; the entire contents of which are incorporated herein by reference.

FIELD

Embodiments described herein relate generally to a failure analysis method, a failure analysis apparatus, and a computer program product.

BACKGROUND

Conventionally, in a manufacturing process of a semiconductor memory, there is a method of specifying a location of a fail bit (failed memory cell) by using a fail bit map (FBM) of the semiconductor memory. For displaying the FBM, first, an electrical test result for each memory cell of the semiconductor memory is detected by using a tester. Then, typically, one-dimensional array information (logical FBM address) corresponding to an order of collecting the electrical test results by the tester is converted into two-dimensional coordinate values (physical FBM address) associated with a physical layout of the memory cells of the semiconductor memory on a wafer, thereby displaying positional information on the failed memory cell determined by the electrical test results on a display device (see Japanese Patent No. 3256555).

Moreover, there is a technology in which the electrical test results output from the tester are divided into a plurality of pieces and the physical position of the fail bit is specified from each divided piece of the electrical test results based on a definition table in which the logical FBM address and the physical FBM address of the electrical test results are associated with each other for each divided piece of the electrical test results (see Japanese Patent Application Laid-open No. 2001-324546).

Recently, increase in capacity of the semiconductor memory has progressed at a very rapid pace. For example, in a NAND flash memory, products having a storage capacity of tens of gigabits have already been mass produced, and the storage capacity has been increasing to reach terabit in a few years. In the above two technologies, a calculation cost proportional to the number of the memory cells is required, so that a processing time for generating the FBM increases with the increase of the storage capacity of a memory of a target product. The increased processing time for generating the FBM means that the time of a failure analysis becomes long. In other words, acceleration of the process of generating the FBM is an urgent need for coping with a large-capacity semiconductor memory.

DETAILED DESCRIPTION

In general, according to one embodiment, securing a first memory in a main memory, storing an electrical test result in which pass/fail information for respective memory cells of a semiconductor memory is arrayed in a logical address order that is an output order from a tester in secured first memory, securing a plurality of second memory areas in each of which loading and storing of each data in a unit size is performed, in the main memory, generating fail bit maps (FBMs) in which the pass/fail information is arrayed in a physical address order corresponding to a physical arrangement of the memory cells of the semiconductor memory based on different parts of the electrical test result stored in the first memory area, respectively, storing the FBMs generated from the different parts of the electrical test result in the second memory areas, respectively, and outputting the FBMs stored in the second memory areas, respectively, are included.

Exemplary embodiments of a failure analysis method, a failure analysis apparatus, and a computer program product will be explained below in detail with reference to the accompanying drawings. The present invention is not limited to the following embodiments.

In a first embodiment, a computer of a multi-core system or a multi-processor system is used for performing a process of generating an FBM from electrical test results by converting a logical FBM address into a physical FBM address at a high speed compared with the conventional technology. Specifically, the electrical test results arrayed by the logical FBM address are divided into a plurality of pieces, and the array of each divided electrical test results is converted. In the followings, the electrical test results arrayed by the logical FBM address are referred to as a logical FBM, and the FBM generated by converting into the physical FBM address is referred to as a physical FBM for distinguishing from the logical FBM. Moreover, a process of converting the logical FBM address into the physical FBM address is referred to as an FBM converting process.

If the FBM converting process performed in the conventional technology is performed by a computer of the multi-core/multi-processor system, a problem as described below occurs. The problem that occurs when the FBM converting process is performed by the computer of the multi-core/multiprocessor system is described with reference to FIG. 1 and FIG. 2.

Figure 1:
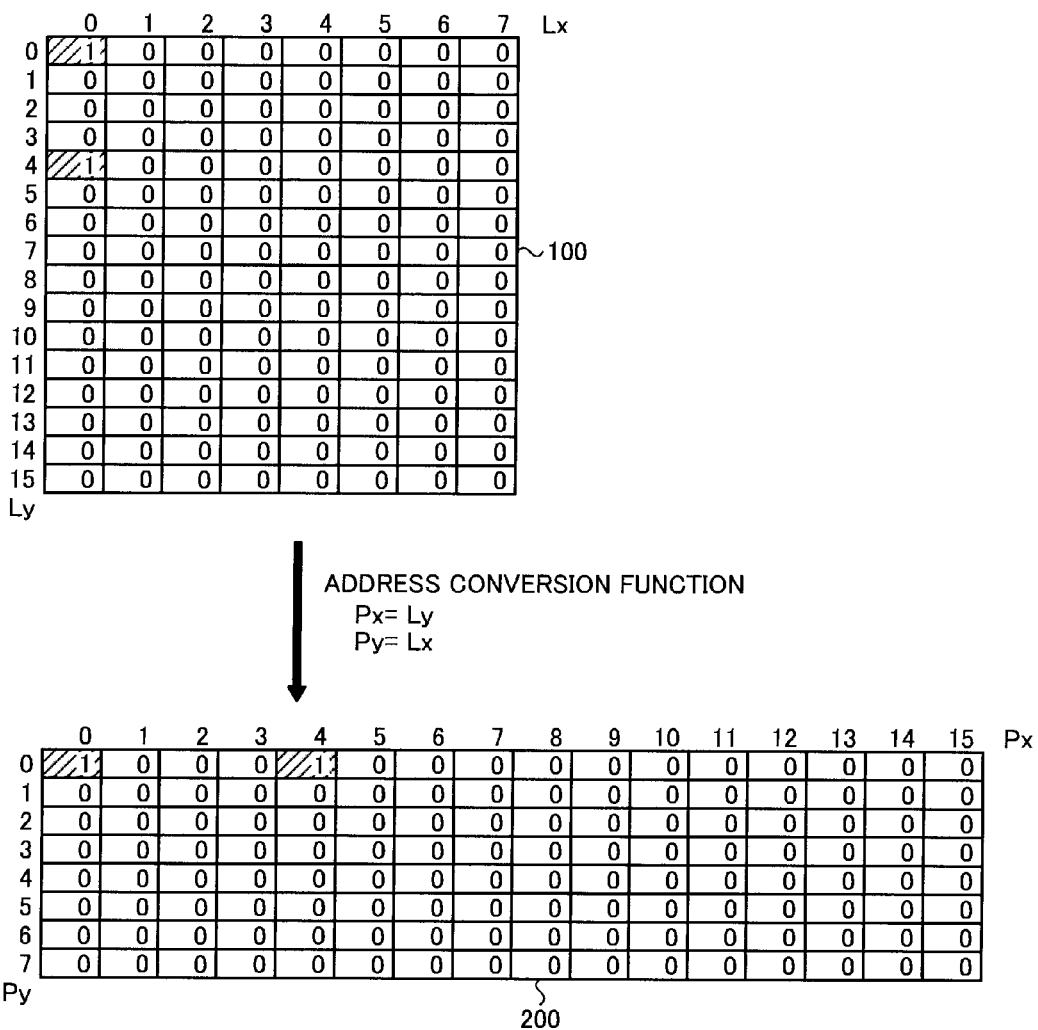
FIG. 1 is a diagram explaining a logical FBM and a physical FBM.

FIG. 1 is a diagram explaining the logical FBM and the physical FBM. A logical FBM 100 is illustrated in the upper portion of the drawing of FIG. 1 and a physical FBM 200 is illustrated in the lower portion of the drawing of FIG. 1. Lx is an X coordinate of the logical FBM address and Ly is a Y coordinate of the logical FBM address. Px is an X coordinate of the physical FBM address and Py is a Y coordinate of the physical FBM address. A bit "1" indicates that the bit is a fail bit. In other words, the logical FBM 100 indicates that the bit of Lx=0, Ly=0 and the bit of Lx=0, Ly=4 are the fail bits.

The relationship between the logical FBM address and the physical FBM address is defined by a conversion function (FBM address conversion function). The FBM address conversion function is typically different depending on a product and is, for example, uniquely assigned based on a product name included in the logical FBM. In the example in FIG. 1, the FBM address conversion function of Px=Ly, Py=Lx is applied to the logical FBM 100. Whereby, Lx=0, Ly=0 is converted into Px=0, Py=0, and Lx=0, Ly=4 is converted into Px=4, Py=0. Consequently, as shown in the physical FBM 200, the bit of Px=0, Py=0 and the bit of Px=4, Py=0 are illustrated as the fail bits.

Figure 2:
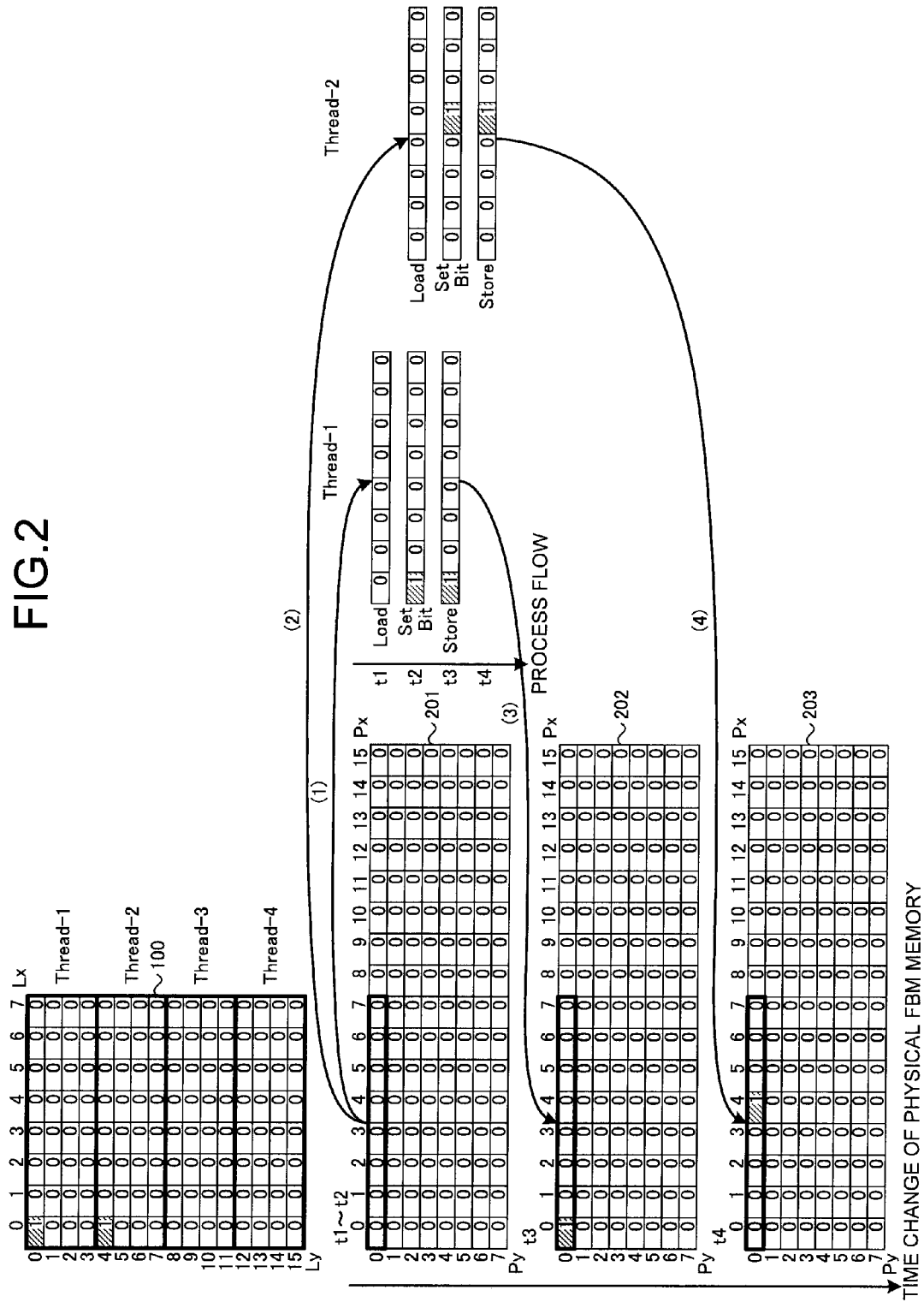
FIG. 2 is a diagram explaining a case where FBM generations are processed in parallel.

FIG. 2 is a diagram explaining the case where the logical FBM 100 is divided into four areas of Ly=0 to 3, Ly=4 to 7, Ly=8 to 11, and Ly=12 to 15, and they are processed in parallel by a plurality of threads (Thread-1, Thread-2, Thread-3, and Thread-4), respectively.

As shown in FIG. 2, Thread-1 converts the fail bit Lx=0, Ly=0 and reflects it in a physical FBM 201 in the initial state in which no fail (Pass) is set to generate a physical FBM 202, and the Thread-2 converts the fail bit Lx=0, Ly=4 and further reflects it to generate a physical FBM 203. In the physical FBM 203, the bit of Px=0, Py=0 is incorrectly set to 0 (Pass) different from the physical FBM 200 shown in FIG. 1. This phenomenon does not always occur and occurs or does not occur depending on the case. This phenomenon occurs when writing in the same byte by Thread-1 and Thread-2 is overlapped although the threads operate asynchronously with each other.

More specifically, at a time t1, Thread-1 loads data of 1 byte (8 bits) including Px=0, Py=0 corresponding to the fail bit (Lx=0, Ly=0) from a memory area (physical-FBM storage memory area) in which the physical FBM 201 is stored ((1) in FIG. 2). At this point, because the physical FBM 201 is stored in the physical-FBM storage memory area, the loaded data is all 0.

At a time t2, Thread-1 sets the fail bit in the loaded data. A left end bit corresponding to Px=0 is set. On the other hand, Thread-2 loads data of 1 byte (8 bits) including Px=4, Py=0 corresponding to the fail bit (Lx=0, Ly=4) from the physical-FBM storage memory area ((2) in FIG. 2). At this point, because the data processed by Thread-1 is still not stored in the physical-FBM storage memory area, the data loaded by Thread-2 is all 0 same as the data loaded by Thread-1 at the time t1.

At a time t3, Thread-1 stores the processed data in the physical-FBM storage memory area ((3) in FIG. 2). In other words, the physical-FBM storage memory area is in a state of storing the physical FBM 202. On the other hand, Thread-2 sets the fail bit in the loaded data. A bit that is fifth from the left corresponding to Px=4 is set.

At a time t4, Thread-2 stores the processed data in the physical-FBM storage memory area ((4) in FIG. 2). With this store process, the data stored by Thread-1 at the time t3, i.e., the physical FBM 202 is overwritten, so that incorrect data is output as the physical FBM 203.

These phenomena are attributed to the fact that the computer operates a main memory in units of word rather than operating in units of bit. In this example, 1 word is equal to 1 byte for simplifying the explanation.

In this manner, if the FBM converting processes are simply parallelized, a simultaneous access to the same byte on the physical FBM by the threads occurs, so that a problem occurs that an incorrect physical FBM may be generated. If the threads are synchronized therebetween and an access to the physical-FBM storage memory area is performed exclusively to prevent such a problem, a processing capability is lowered. For example, in the above example, loading by Thread-2 needs to be started after waiting for the physical FBM to become the state of the physical FBM 202, so that the time for finishing all of processes is increased. In the first embodiment of the present invention, the physical-FBM storage memory area is divided to cause each thread to access a different physical-FBM storage memory area thereby preventing the simultaneous access to the same byte from occurring. In the followings, the first embodiment of the present invention is explained. The above explained technology of simply parallelizing the FBM converting processes is referred to as a technology in a comparison example.

Figure 3:
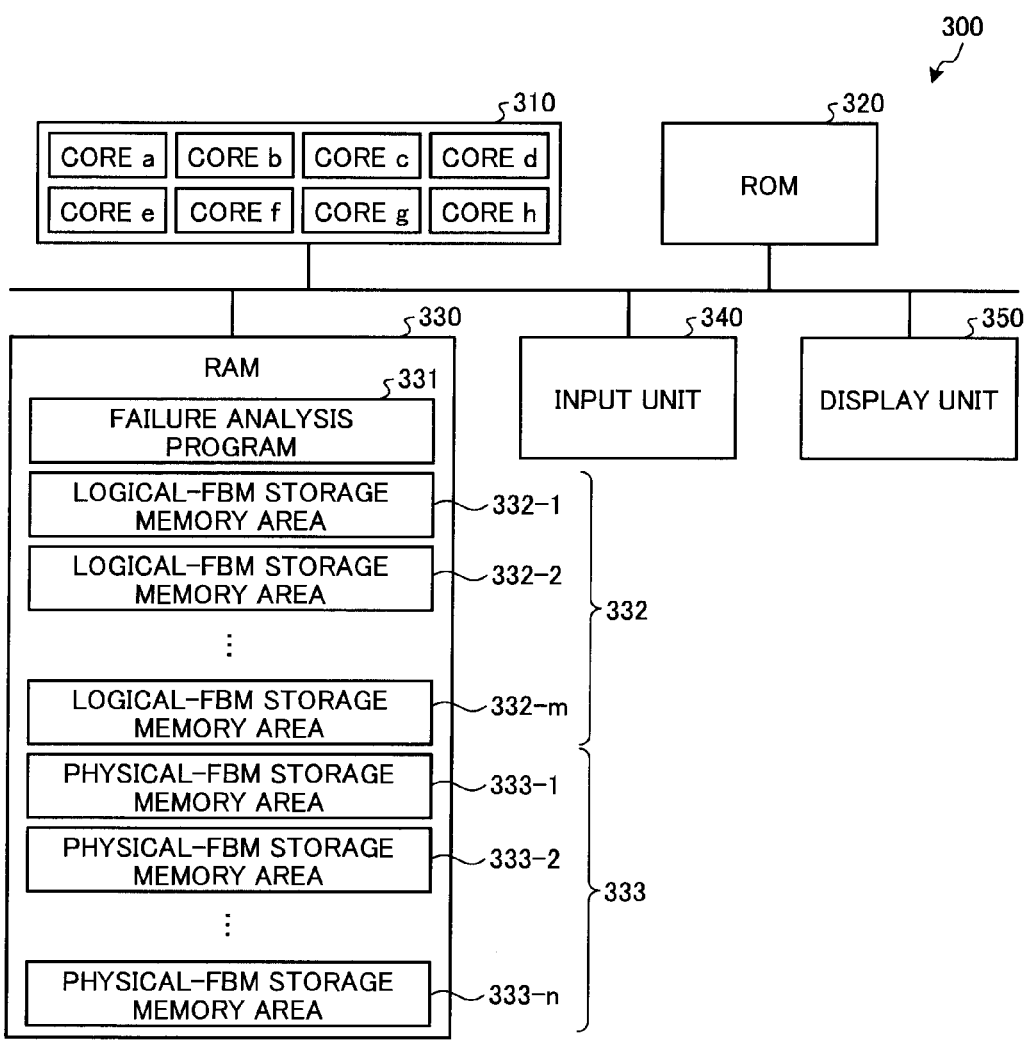
FIG. 3 is a block diagram illustrating a configuration of a failure analysis apparatus according to a first embodiment of the present invention.

FIG. 3 is a block diagram illustrating a configuration of a failure analysis apparatus according to the first embodiment of the present invention. As shown in FIG. 3, a failure analysis apparatus 300 includes a multi-core processor 310 that includes cores (in this example, eight cores, i.e., core a to core h) as a plurality of operation units each of which can perform the thread independently, a ROM (Read Only Memory) 320, a RAM (Random Access Memory) 330 as a main memory, an input unit 340, and a display unit 350. The multi-core processor 310, the ROM 320, the RAM 330, the input unit 340, and the display unit 350 are connected with each other via a bus.

The multi-core processor 310 executes a failure analysis program 331 that is a computer program realizing the failure analysis apparatus 300 in the present embodiment. The display unit 350 is a display device such as a liquid crystal monitor and displays output information to a user, such as an operation screen, based on an instruction from the multi-core processor 310. The input unit 340 is configured to include a mouse and a keyboard, to which an operation of the failure analysis apparatus 300 from a user is input. Operation information input to the input unit 340 is sent to the multi-core processor 310.

The failure analysis program 331 is stored in the ROM 320 and is loaded in the RAM 330 via a bus line. FIG. 3 illustrates a state where the failure analysis program 331 is loaded in the RAM 330. The multi-core processor 310 executes the failure analysis program 331 loaded in the RAM 330. Specifically, in the failure analysis apparatus 300, the multi-core processor 310 reads out the failure analysis program 331 from the ROM 320 and loads it in a program storage area in the RAM 330 in accordance with an instruction input from the input unit 340 by a user.

Typically, the logical FBM is divided into a plurality of pieces in a tester to be output because the capacity of a capture memory included in the tester is too small to generate the logical FBM of the semiconductor memory at a time and for other reasons. In this example, the logical FBM is divided into m pieces. These divided logical FBMs (pieces of the electrical test results) are each input from a not-shown external storage device or the like, and are stored in a plurality of areas (a logical-FBM storage memory area 332-1 to a logical-FBM storage memory area 332-m) in the RAM 330, respectively. In the followings, the logical-FBM storage memory area 332-1 to the logical-FBM storage memory area 332-$m$ are in some cases expressed as a logical-FBM storage memory area 332 indicating all of them.

The multi-core processor 310 executes the failure analysis program 331 loaded in the program storage area in the RAM 330 to generate a plurality (in this example, n pieces) of the threads (physical-FBM converting-and-writing threads to be described later) for performing the FBM converting processes in parallel by the cores a to h included therein. The threads secure memory areas (a physical-FBM storage memory area 333-1 to a physical-FBM storage memory area 333-$n$) for individually storing the physical FBMs, respectively. In the followings, the physical-FBM storage memory area 333-1 to the physical-FBM storage memory area 333-$n$ are expressed as a physical-FBM storage memory area 333 in some cases indicating all of them. Each thread takes charge of part of the physical FBM on which the FBM converting process is performed and stores the physical FBM of the part in charge generated individually by the FBM converting process in a corresponding physical-FBM storage memory area in the physical-FBM storage memory area 333. The multi-core processor 310 outputs the physical FBM of the part that each thread takes charge of, which is stored in a corresponding physical-FBM storage memory area, to an external storage device or the like.

It is applicable that the failure analysis program 331 is stored in a storage device such as an external storage device instead of the ROM 320.

The configuration can be such that the failure analysis program 331 executed in the failure analysis apparatus 300 in the first embodiment is stored in a computer connected to the network and is provided by downloading it via the network. Moreover, the configuration can be such that the failure analysis program 331 executed in the failure analysis apparatus 300 in the first embodiment is provided or distributed via the network. Furthermore, the configuration can be such that the failure analysis program 331 in the first embodiment is incorporated in the ROM 320 or the like in advance and is provided to the failure analysis apparatus 300 in the first embodiment.

Figure 4:
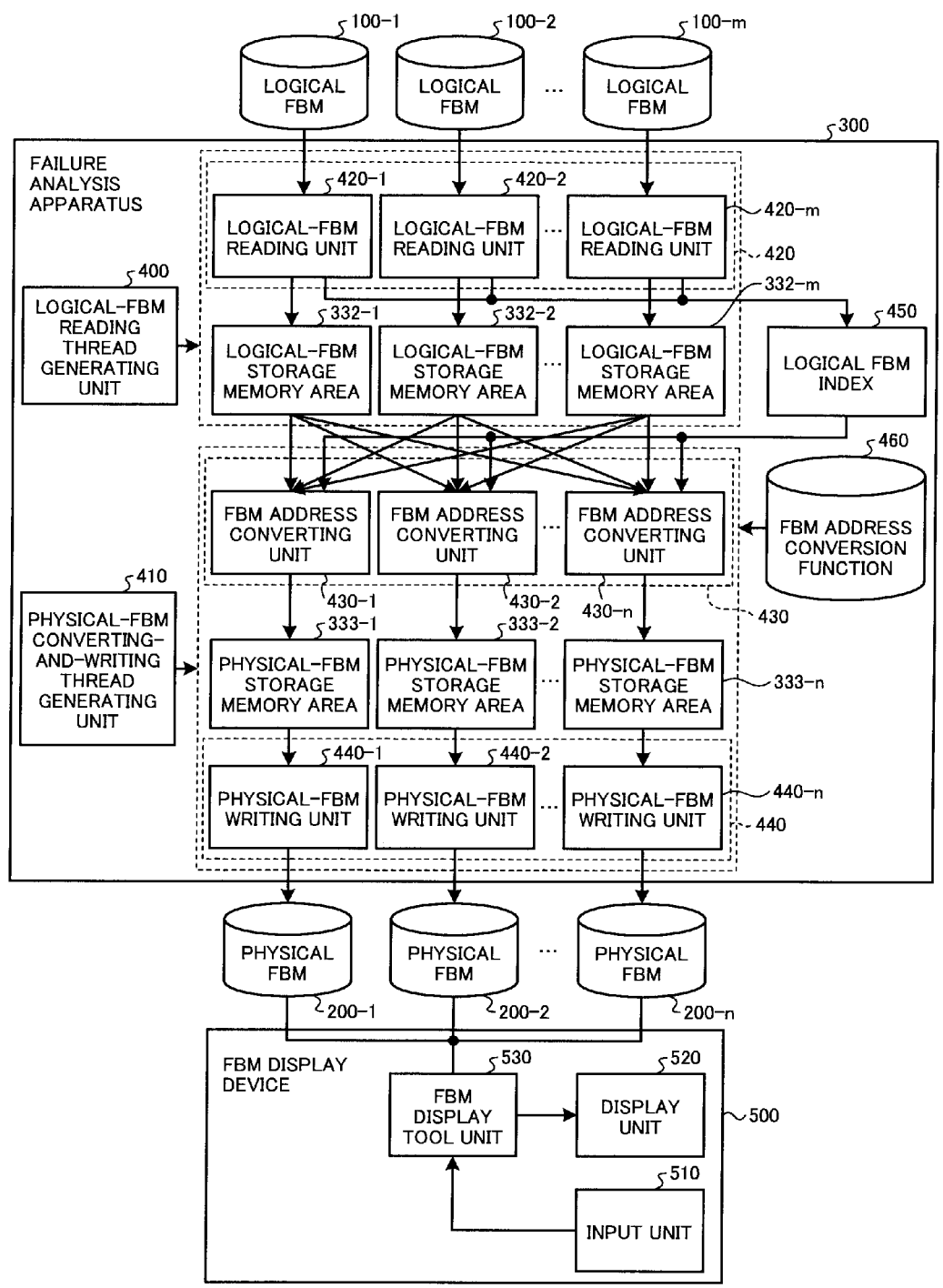
FIG. 4 is a diagram explaining a configuration of a function unit of the failure analysis apparatus according to the first embodiment of the present invention.

FIG. 4 is a diagram explaining a configuration of a function unit of the failure analysis apparatus 300 that is generated by the multi-core processor 310 executing the failure analysis program 331. As shown in FIG. 4, the failure analysis apparatus 300 includes a logical-FBM reading thread generating unit 400, a physical-FBM converting-and-writing thread generating unit 410, and an FBM address conversion function 460.

The logical-FBM reading thread generating unit 400 generates m number of the threads (logical-FBM reading threads). The core a to the core h function as a logical-FBM reading unit 420 (a logical-FBM reading unit 420-1 to a logical-FBM reading unit 420-$m$) for securing the logical-FBM storage memory area 332 (the logical-FBM storage memory area 332-1 to the logical-FBM storage memory area 332-$m$) corresponding to the logical FBM 100 (a logical FBM 100-1 to a logical FBM 100-$m$) divided into a plurality of pieces and storing into the secured logical-FBM storage memory area 332, by performing different logical-FBM reading threads, respectively. Each of the logical-FBM storage memory area 332-1 to the logical-FBM storage memory area 332-$m$ can be secured before or at the time the logical-FBM reading thread generating unit 400 generates the logical-FBM reading thread. Moreover, when m is larger than the number of the cores included in the multi-core processor 310, the configuration can be such that the logical-FBM reading thread generating unit 400 accumulates the generated logical-FBM reading threads in a thread queue and the core a to the core h sequentially perform the logical-FBM reading threads accumulated in the thread queue. The logical FBM 100-1 to the logical FBM 100-$m$ can be distinguished from each other from a file name or the like.

The logical-FBM reading unit 420 (the logical-FBM reading unit 420-1 to the logical-FBM reading unit 420-$m$) counts the number of the fail bits included in the logical FBM 100 (the logical FBM 100-1 to the logical FBM 100-$m$) read by itself, respectively. Then, the logical-FBM reading unit 420 associates a pointer of a top address of the logical-FBM storage memory area 332 (the logical-FBM storage memory area 332-1 to the logical-FBM storage memory area 332-$m$) used by itself and a count value with an index number as an identifier of a piece of the logical FBM 100. In this example, "x" of the logical FBM 100-"x" is directly used as the index number. The associations generated for respective logical-FBM reading units in the logical-FBM reading unit 420 constitute a table (logical FBM index 450). The area in which the logical FBM index 450 is stored can be at any storage location so long as the multi-core processor 310 can access the location, and, for example, can be stored in the RAM 330.

Figures 5, 6:
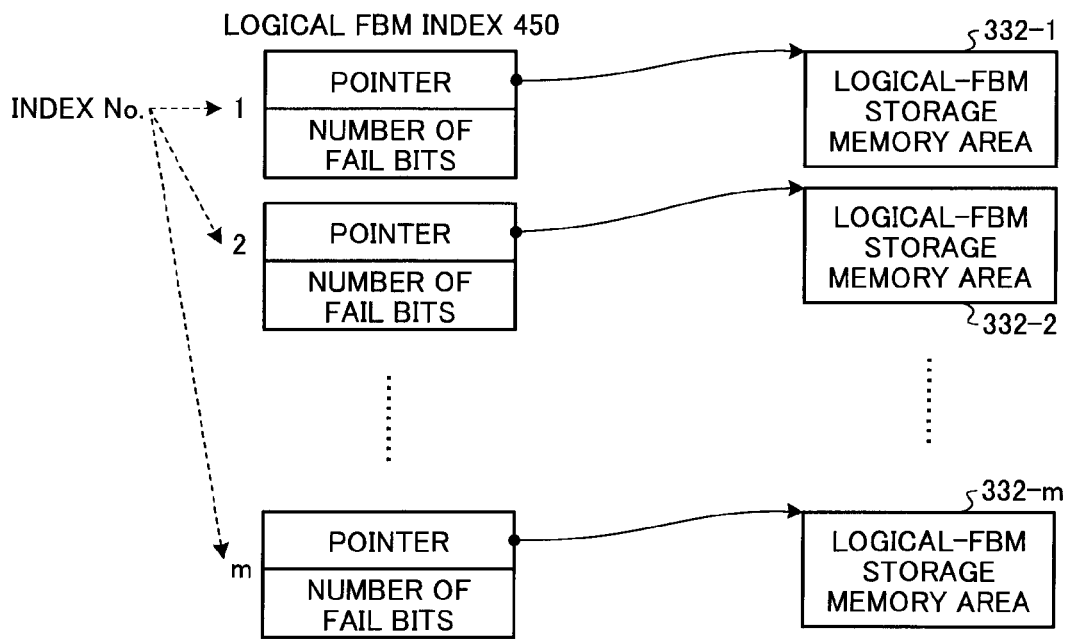
FIG. 5 is a diagram explaining a data structure of a logical FBM index.
FIG. 6 is a diagram explaining a specific example of the logical FBM index.

FIG. 5 is a diagram explaining a data structure of the logical FBM index 450. As shown in FIG. 5, the logical FBM index 450 is configured to include m pairs of two elements of the pointer and the number of the fail bits, in which m is a logical FBM division number.

FIG. 6 is a diagram explaining a specific example of the logical FBM index 450. As shown in FIG. 6, m=4, and entries whose index Nos. are 1, 2, 3, and 4 include information in which the pointer is "0x72000000", "0x72000010", "0x72000020", and "0x72000030", and information in which the number of the fail bits is 1, 1, 0, and 0, respectively.

The physical-FBM converting-and-writing thread generating unit 410 generates n number of the physical-FBM converting-and-writing threads. The core a to the core h function as an FBM address converting unit 430 (an FBM address converting unit 430-1 to an FBM address converting unit 430-$n$) that performs the FBM converting process with respect to the part in charge in the physical FBM 200 stored in the physical-FBM storage memory area 333-1 to the physical-FBM storage memory area 333-$n$ in a distributed manner and as a physical-FBM writing unit 440 (a physical-FBM writing unit 440-1 to a physical-FBM writing unit 440-$n$) that outputs the physical FBM 200 (a physical FBM 200-1 to a physical FBM 200-$n$) generated by the FBM converting processes to an external storage device, by performing the physical-FBM converting-and-writing threads, respectively. When performing the FBM converting process, the FBM address converting unit 430 uses the FBM address conversion function 460. The FBM address conversion function 460 can be input via an external storage device or the like. Moreover, the FBM address conversion function 460 can be databased for each product of the semiconductor memory to be an analysis target, and the FBM address converting unit 430 can obtain a corresponding FBM address conversion function 460 by searching for the database with a product name or the like.

The n divided pieces of the physical FBM 200 that are output from the failure analysis apparatus 300 are input to an FBM display device 500. The FBM display device 500 includes an input unit 510 that is configured to include a keyboard, a mouse, and the like, a display unit 520 as a display device such as a liquid crystal monitor, and an FBM display tool unit 530. The FBM display tool unit 530 displays on the display unit 520 the physical FBM of the area designated by an operation input by a user input from the input unit 510 among the physical FBM 200-1 to the physical FBM 200-n.

The division number (n) of the physical FBM can be any value. "n" can be a value larger than or smaller than the number of the cores included in the multi-core processor 310. When n is larger than the number of the cores included in the multi-core processor 310, in the same manner as the case of the logical-FBM reading thread, the configuration can be such that the physical-FBM converting-and-writing thread generating unit 410 accumulates the generated physical-FBM converting-and-writing threads in a thread queue and the core a to the core h sequentially perform the physical-FBM converting-and-writing threads accumulated in the thread queue. In the FBM display device 500, the load on the process of reading out the area designated by the operation input is reduced as the value of n becomes large and therefore the whole process becomes fast. It is applicable to set the value of n in accordance with a request for the FBM display device 500 to perform the process at a high speed.

Figure 7:
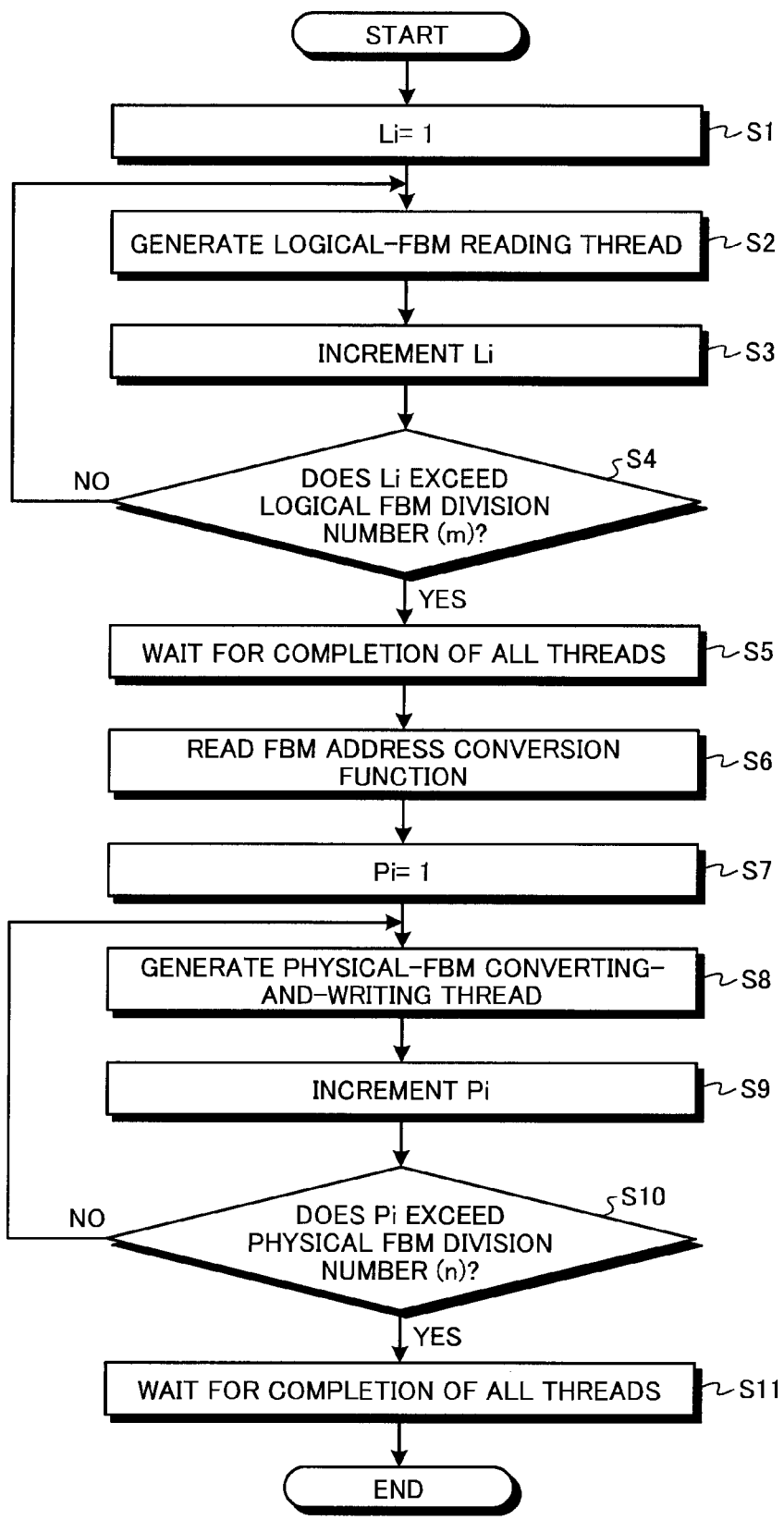
FIG. 7 is a flowchart explaining a failure analysis method according to the first embodiment of the present invention.

Next, the failure analysis method of the first embodiment of the present invention performed by using the failure analysis apparatus 300 is explained. FIG. 7 is a flowchart explaining the failure analysis method. First, the logical-FBM reading thread generating unit 400 sets Li that is a variable to be used in a processing loop (Step S2 to Step S4) of generating the logical-FBM reading thread to 1 (Step S1). Li is defined as a logical FBM division number. The logical FBM division number Li can take a value of an integer from 1 to m.

Then, the logical-FBM reading thread generating unit 400 generates the logical-FBM reading thread (Step S2) and proceeds to the next step without waiting for completion of execution of the thread. In other words, after Step S2, the logical-FBM reading thread generating unit 400 increments the logical FBM division number Li (Step S3).

Figure 8:
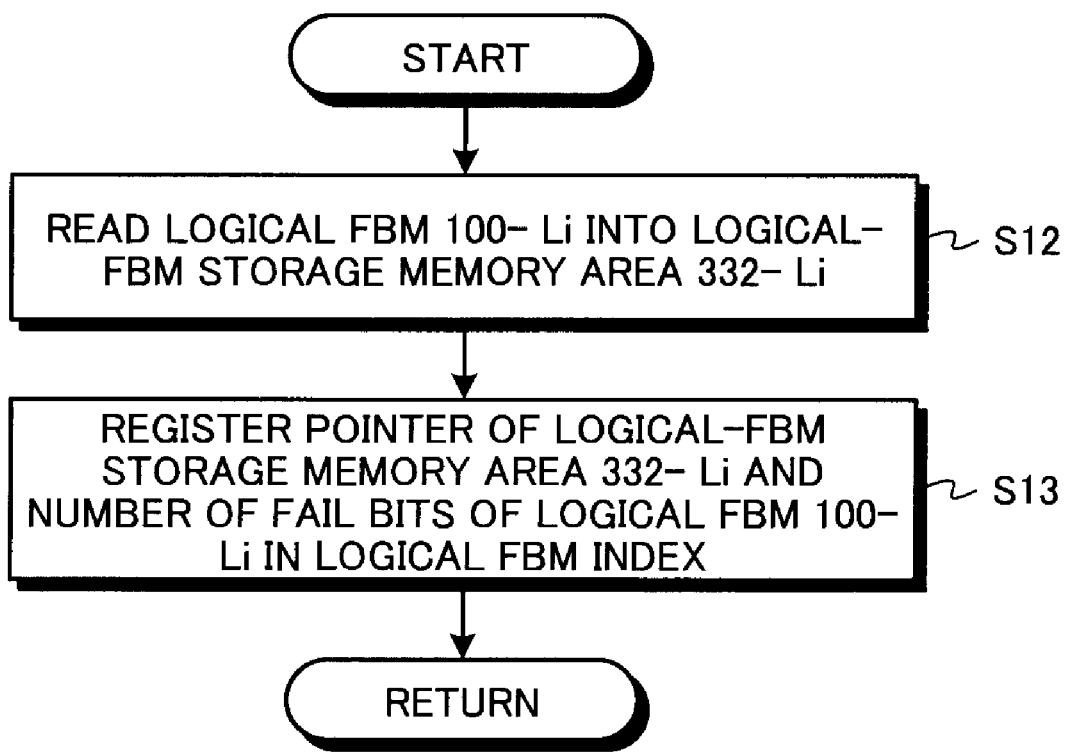
FIG. 8 is a flowchart explaining an operation of a logical-FBM reading unit.

FIG. 8 is a flowchart explaining an operation of the logical-FBM reading unit 420 when the generated logical-FBM reading thread is performed. In this example, when one of the core a to the core h performs the logical-FBM reading thread, the core functions as a logical-FBM reading unit 420-Li corresponding to the value Li of the logical FBM division number at the time of generating the logical-FBM reading thread, and the logical-FBM reading unit 420-Li reads a piece of the logical FBM 100 corresponding to the index number Li, i.e., a logical FBM 100-Li.

As shown in FIG. 8, first, the logical-FBM reading unit 420-Li reads the logical FBM 100-Li that is one divided piece of the logical FBM 100 into a logical-FBM storage memory area 332-Li (Step S12). Specifically, the logical-FBM reading unit 420-Li counts the number of the fail bits included in the logical FBM 100-Li and secures the logical-FBM storage memory area 332-Li, and stores the logical FBM 100-Li in the secured logical-FBM storage memory area 332-Li.

Then, the logical-FBM reading unit 420-Li sets the top address of the logical-FBM storage memory area 332-Li to the pointer of the index No.=Li in the logical FBM index 450 and the counted count value to the number of the fail bits (Step S13), and the operation of the logical-FBM reading unit 420-Li returns.

After Step S3, the logical-FBM reading thread generating unit 400 determines whether the logical FBM division number Li exceeds the division number m of the logical FBM 100 (Step S4). When the logical FBM division number Li does not exceed the division number m of the logical FBM 100 (No at Step S4), the system control proceeds to Step S2. When the logical FBM division number Li exceeds the division number m of the logical FBM 100 (Yes at Step S4), the logical-FBM reading thread generating unit 400 waits for completion of execution of all of the generated logical-FBM reading threads (Step S5).

When execution of all of the logical-FBM reading threads is finished, the physical-FBM converting-and-writing thread generating unit 410 reads the FBM address conversion function 460 corresponding to the physical FBM 200 stored in the physical-FBM storage memory area 333-1 to the physical-FBM storage memory area 333-n in a distributed manner (Step S6).

Then, Pi that is a variable used for a processing loop (Step S8 to Step S10) for generating the physical-FBM converting-and-writing thread is set to 1 (Step S7). Pi is defined as a physical FBM division number. The physical FBM division number Pi can take a value of an integer from 1 to n.

The physical-FBM converting-and-writing thread generating unit 410 generates the physical-FBM converting-and-writing thread (Step S8) and proceeds to the next step without waiting for completion of execution of the thread. In other words, after Step S8, the physical-FBM converting-and-writing thread generating unit 410 increments the physical FBM division number Pi (Step S9).

Figure 9:
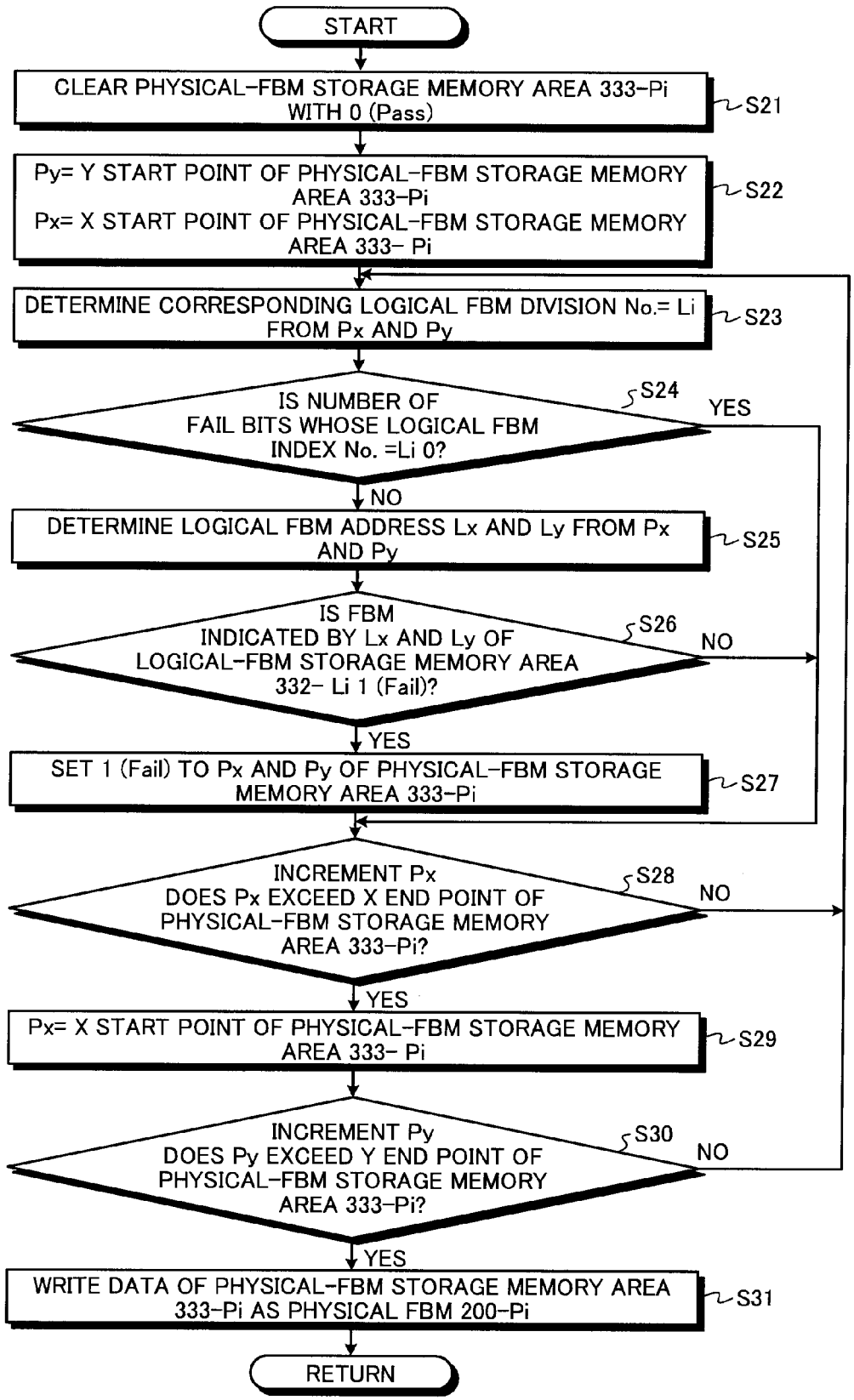
FIG. 9 is a flowchart explaining an operation of an FBM address converting unit and a physical-FBM writing unit.

FIG. 9 is a flowchart explaining an operation of the FBM address converting unit 430 and the physical-FBM writing unit 440 that are realized by performing the generated physical-FBM converting-and-writing threads. In this example, when one of the core a to the core h performs the physical-FBM converting-and-writing thread, the core functions as an FBM address converting unit 430-Pi and a physical-FBM writing unit 440-Pi corresponding to the value Pi of the physical FBM division number at the time of generating the physical-FBM converting-and-writing thread.

As shown in FIG. 9, first, the FBM address converting unit 430-Pi clears the content of a physical-FBM storage memory area 333-Pi with 0 (Pass) (Step S21). Specifically, the FBM address converting unit 430-Pi secures the physical-FBM storage memory area 333-Pi and sets all the content of the secured physical-FBM storage memory area 333-Pi to 0. This is because the number of Pass is larger than the number of the fail bits in most of the FBMs, so that a subsequent process is reduced by clearing the physical-FBM storage memory area 333-Pi in advance with 0 (Pass) of a larger number.

Then, the FBM address converting unit 430-Pi sets a Y start point of the physical-FBM storage memory area 333-Pi to a physical FBM address Py and sets an X start point of the physical-FBM storage memory area 333-Pi to a physical FBM address Px (Step S22).

Then, the FBM address converting unit 430-Pi determines the logical FBM division number Li corresponding to Px and Py (Step S23). The logical FBM division number Li can be determined by using the values of m and n and the FBM address conversion function 460.

Then, the FBM address converting unit 430-Pi checks the number of the fail bits whose index No.=Li in the logical FBM index 450, and determines whether the number of the fail bits is 0 (Step S24). When the number of the fail bits is 0 (Yes at Step S24), the system control skips the processes at Step S25 to Step S27 and proceeds to Step S28 to be described later.

When the number of the fail bits is 1 or more, i.e., the number of the fail bits is not 0 (No at Step S24), the FBM address converting unit 430-Pi determines the logical FBM address Lx and Ly corresponding to Px and Py by using the FBM address conversion function 460 (Step S25).

Then, the FBM address converting unit 430-Pi refers to a bit at a position indicated by the determined Lx and Ly on the logical-FBM storage memory area 332-Li and determines whether the value of the bit is 1 (Fail) (Step S26). When the value of the bit indicated by Lx and Ly is 0 (Pass) (No at Step S26), the system control skips the process at Step S27 and proceeds to Step S28 to be described later.

When the value of the bit indicated by Lx and Ly is 1 (Yes at Step S26), the FBM address converting unit 430-Pi sets 1 (Fail) to the bit of Px and Py of the physical-FBM storage memory area 333-Pi (Step S27).

Then, the FBM address converting unit 430-Pi increments Px and determines whether Px exceeds an X end point of the physical-FBM storage memory area 333-Pi (Step S28). When Px does not exceed the X end point (No at Step S28), the system control proceeds to Step S23. When Px exceeds the X end point (Yes at Step S28), the FBM address converting unit 430-Pi sets the X start point of the physical-FBM storage memory area 333-Pi to Px (Step S29).

Then, the FBM address converting unit 430-Pi increments Py and determines whether Py exceeds a Y end point of the physical-FBM storage memory area 333-Pi (Step S30). When Py does not exceed the Y end point (No at Step S30), the system control proceeds to Step S23. When Py exceeds the Y end point (Yes at Step S30), the physical-FBM writing unit 440-Pi writes data stored in the physical-FBM storage memory area 333-Pi to an external storage device or the like as a physical FBM 200-Pi (Step S31), and the operation of the FBM address converting unit 430-Pi and the physical-FBM writing unit 440-Pi returns.

After Step S9, the physical-FBM converting-and-writing thread generating unit 410 determines whether the physical FBM division number Pi exceeds the division number (n) of the physical FBM 200 (Step S10). When the physical FBM division number Pi does not exceed the division number (n) (No at Step S10), the system control proceeds to Step S8.

When the physical FBM division number Pi exceeds the division number (n) of the physical FBM 200 (Yes at Step S10), the physical-FBM converting-and-writing thread generating unit 410 waits for completion of execution of all of the generated physical-FBM converting-and-writing threads (Step S11). When execution of all of the physical-FBM converting-and-writing threads is finished, the operation ends.

Figure 10:
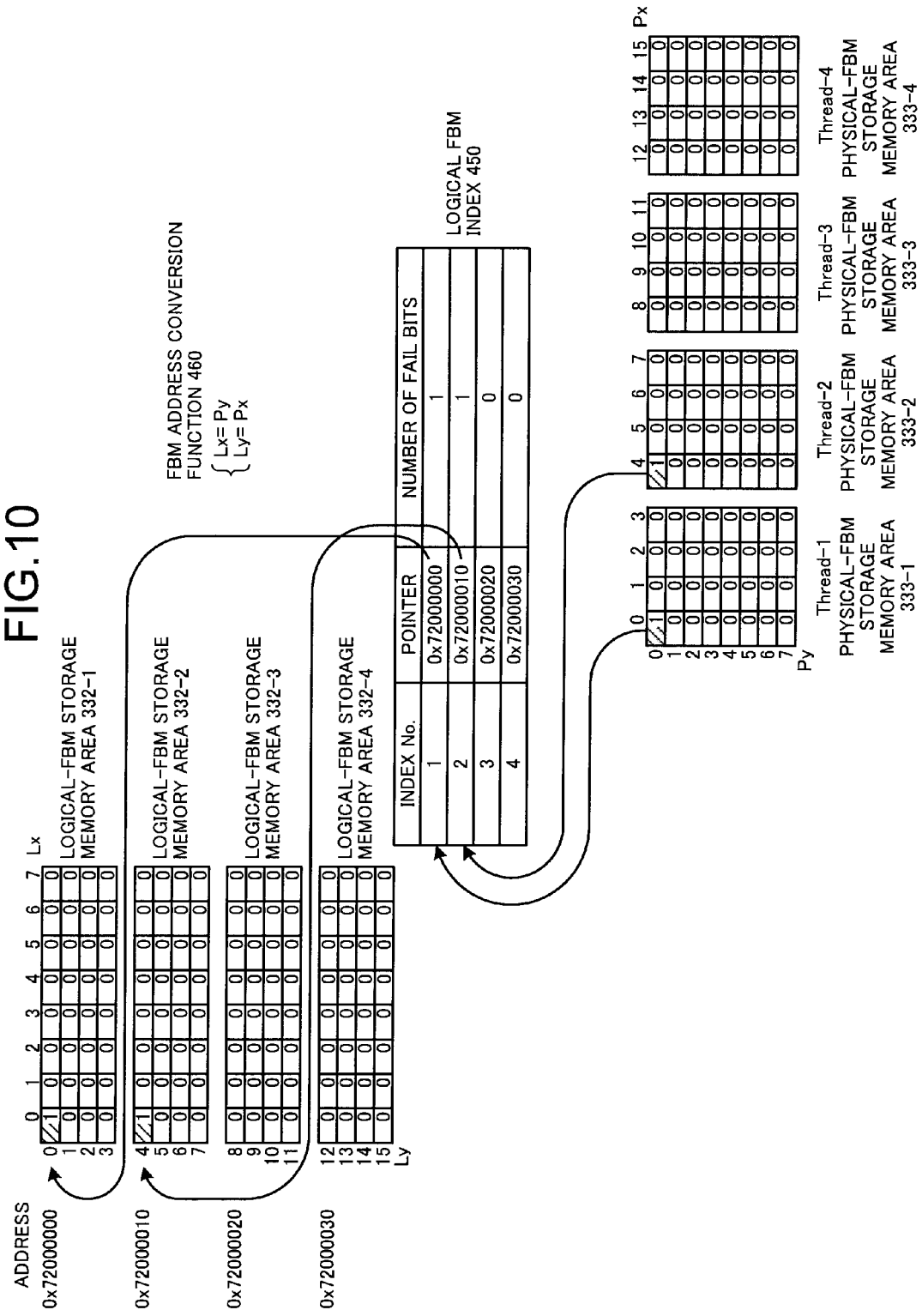
FIG. 10 is a diagram explaining a relationship between the logical FBM, the physical FBM, and the logical FBM index.

It is explained that the problem of erroneous writing of data at the parallel processing is solved with the above configuration and operation with reference to FIG. 10. FIG. 10 is a diagram explaining a relationship between the logical FBM 100, the physical FBM 200, and the logical FBM index 450 in the first embodiment.

In FIG. 10, the physical-FBM storage memory area 333 is divided into four areas (the physical-FBM storage memory area 333-1 to the physical-FBM storage memory area 333-4) in a Px address direction and the logical-FBM storage memory area 332 is also divided into four areas (the logical-FBM storage memory area 332-1 to the logical-FBM storage memory area 332-4) in an Ly address direction. Because the physical FBM 200 is divided into four pieces, the address converting processes are performed by totally four threads of a physical-FBM converting-and-writing thread Thread-1 that takes charge of the physical-FBM storage memory area 333-1, a physical-FBM converting-and-writing thread Thread-2 that takes charge of the physical-FBM storage memory area 333-2, a physical-FBM converting-and-writing thread Thread-3 that takes charge of the physical-FBM storage memory area 333-3, and a physical-FBM converting-and-writing thread Thread-4 that takes charge of the physical-FBM storage memory area 333-4.

It is determined whether Thread-1 sets 1 (Fail) to the bit of the physical FBM address Px=0, Py=0 as follows. The FBM address conversion function 460 is Lx=Py, Ly=Px, the logical-FBM storage memory area 332 is divided into four areas equally in the Ly direction, and the physical-FBM storage memory area 333 is divided into four areas equally in the Px direction, so that the relationship of the index No. (Inx)=Px/4+1 is satisfied (numbers after the decimal point are truncated). It is recognized from this relational expression that a bit in the logical FBM 100 corresponding to the bit of Px=0, Py=0 is stored in the logical-FBM storage memory area 332-1 corresponding to the index No.=1. The FBM address conversion function 460 can be configured to include this relational expression.

Then, the number of the fail bits of the index No.=1 in the logical FBM index 450 is referred to, and because the number of the fail bits is 1, the logical-FBM storage memory area 332-1 is referred to. For an address on the logical-FBM storage memory area 332-1, the logical FBM address Lx=0, Ly=0 is determined based on Lx=Py, Ly=Px of the FBM address conversion function 460. It is determined that 1 (Fail) is set to the bit of Px=0, Py=0 of the physical-FBM storage memory area 333-1 because the bit of Lx=0, Ly=0 of the logical-FBM storage memory area 332-1 is 1 (Fail).

The operation of setting to the bit of Px=0, Py=0 is accompanied by the operation of loading and storing with respect to 1 byte (8 bits) including the bit of Px=0, Py=0 stored in the physical-FBM storage memory area 333-1. In this example, the bit of Px=0, Py=0, the bit of Px=1, Py=0, the bit of Px=2, Py=0, the bit of Px=3, Py=0, the bit of Px=0, Py=1, the bit of Px=1, Py=1, the bit of Px=2, Py=1, and the bit of Px=3, Py=1 are loaded and stored from the physical-FBM storage memory area 333-1.

In the similar manner, when the operation of setting 1 (Fail) to the bit of Px=0, Py=0 by Thread-2 is performed, the bit of Px=4, Py=0, the bit of Px=5, Py=0, the bit of Px=6, Py=0, the bit of Px=7, Py=0, the bit of Px=4, Py=1, the bit of Px=5, Py=1, the bit of Px=6, Py=1, and the bit of Px=7, Py=1 are loaded and stored from the physical-FBM storage memory area 333-2.

In this manner, although both of Thread-1 and Thread-2 perform a memory access for each byte, the area to which the memory access is performed by Thread-1 and the area to which the memory access is performed by Thread-2 are separated. In other words, Thread-1 to Thread-4 do not access the same byte at the same timing. Therefore, erroneous writing that occurs when using the technology in the comparison example does not occur.

In the above explanation, it is explained that the FBM address converting unit 430 clears the physical-FBM storage memory area 333 with 0 (Pass), refers to a bit stored in the logical FBM 100, and, when a reference destination is 1 (Fail), sets 1 to a corresponding storage destination of the physical FBM 200; however, the configuration can be such that when a bit stored in the logical FBM 100 is 0 (Pass), 0 is set to a corresponding storage destination of the physical FBM 200, and when a bit stored in the logical FBM 100 is referred to and a reference destination is 1 (Fail), 1 is set to a corresponding storage destination of the physical FBM 200.

As explained above, according to the present embodiment, a plurality of the cores included in the multi-core processor 310 is each configured to include the logical-FBM reading unit 420 that secures the logical-FBM storage memory area 332 (first memory area) in the RAM 330 (main memory) and stores the logical FBM 100 (electrical test results) input from the outside in the logical-FBM storage memory area 332, and the FBM address converting unit 430 that secures the physical-FBM storage memory area 333 (second memory area), in which loading and storing in unit size is individually performed, in the RAM 330, sequentially refers to a bit (pass/fail information) of each memory cell that is included in a part that a local core takes charge of and is stored in a logical address order among the electrical test results stored in the logical-FBM storage memory area 332, and writes the referred bit in an address (memory address) in the physical-FBM storage memory area 333 corresponding to the physical FBM address (physical address) corresponding to the logical FBM address (logical address) of the referred bit, so that each core accesses the physical-FBM storage memory area 333 that is individually secured, therefore the accesses to the same byte at the same timing do not occur. Thus, because each core can generate the FBM of a part that a local core takes charge of asynchronously, the FBM can be generated at a high speed.

Moreover, it is configured such that the logical FBM 100 is divided at the time of being input from the outside or is divided by the cores, and each core individually secures the logical-FBM storage memory area 332 that stores one of the pieces of the logical FBM 100, generates the logical FBM index 450 in which the top address of the secured logical-FBM storage memory area 332 is associated with the index number that identifies the piece of the logical FBM 100, and specifies an address in which a part that a local core takes charge of is stored in the RAM 330 by referring to the logical FBM index 450, so that the processing time for reading the logical FBM 100 is shortened, thus the FBM can be generated at a high speed.

Furthermore, it is configured such that each core counts the fail bit (fail information) included in one of the pieces of the logical FBM 100 and individually secures the logical-FBM storage memory area 332 that stores the piece of the logical FBM 100, generates the logical FBM index 450 in which the top address of the secured logical-FBM storage memory area 332 and the count value of the fail bit are associated with the index number for identifying the piece of the logical FBM 100, determines whether the piece that includes the fail bit is stored in the logical-FBM storage memory area 332 in which a part that a local core takes charge of is stored among the logical-FBM storage memory areas 332 based on the count value described in the logical FBM index 450, and, when the piece that includes the fail bit is stored, specifies an address in which the part that the local core takes charge of is stored in the RAM 330, so that a reference frequency of the RAM 330 can be reduced.

Moreover, it is configured such that each core determines whether the count value of the fail bit is zero value, and secures the logical-FBM storage memory area 332 when the count value is not zero value and does not secure the logical-FBM storage memory area 332 when the count value is zero value, so that the capacity resource of the RAM 330 can be saved. Furthermore, because the piece of the logical FBM 100 that does not include the fail bit is not referred to, the FBM can be generated at a high speed.

In the above explanation, the case is explained in which the logical FBM 100 is input to the failure analysis apparatus 300 in the divided state; however, the logical FBM 100 can be input as one file that is not divided. In this case, it is sufficient that the logical-FBM reading unit 420-Li seeks a read point after opening the file of the logical FBM 100 and reads only the area of the target logical FBM 100-Li.

Furthermore, the case is explained in which the failure analysis apparatus 300 outputs the physical FBM 200 in the divided state; however, it is applicable that the physical FBM 200-1 to the physical FBM 200-*n* that are divided are integrated into one file and the integrated physical FBM 200 is output.

Moreover, the failure analysis apparatus 300 is configured to include a plurality of the cores as the operation units; however, the failure analysis apparatus 300 can be applied to a computer of a so-called multi-processor system that includes a plurality of processors as the operation units.

In the first embodiment, the logical-FBM reading unit 420 stores the divided logical FBM 100 in the logical-FBM storage memory area 332 even if the logical FBM 100 does not include the fail bit. In the second embodiment of the present invention, when the divided logical FBM 100 does not include the fail bit, the logical FBM 100 is not stored in the logical-FBM storage memory area 332.

Figure 11:
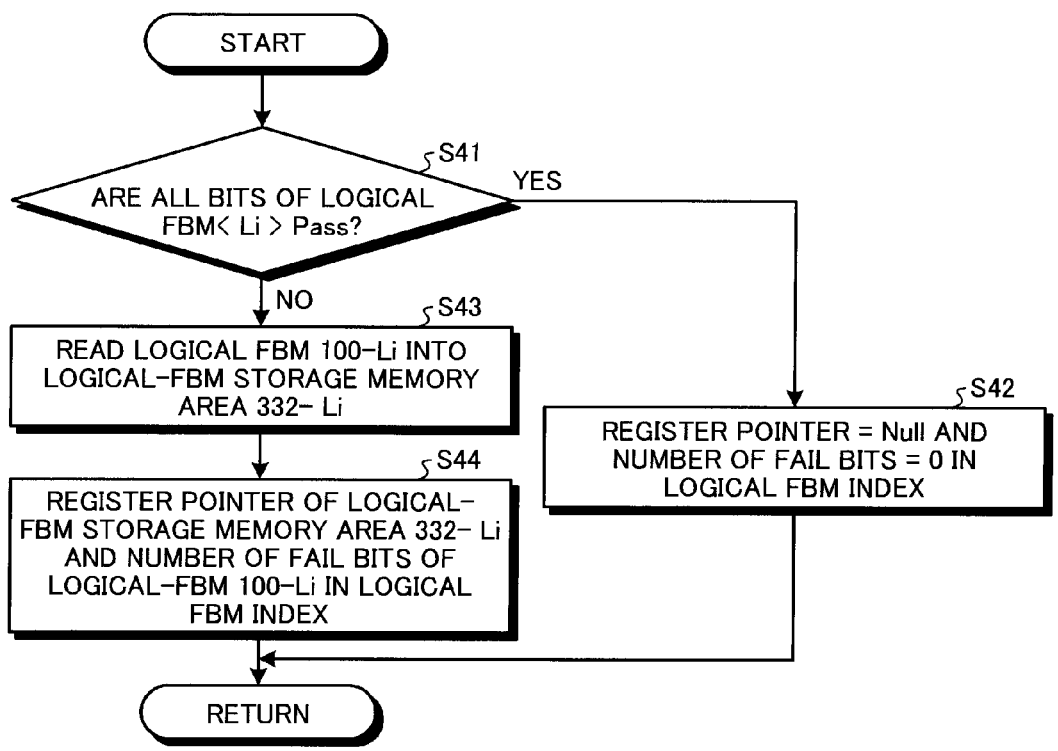
FIG. 11 is a flowchart explaining an operation when performing logical-FBM reading threads in a second embodiment.

FIG. 11 is a flowchart explaining an operation when the core a to the core h perform logical-FBM reading threads in the second embodiment. Logical-FBM reading units realized by the core a to the core h performing the logical-FBM reading threads in the second embodiment are denoted by a reference numeral 620 to be distinguished from the logical-FBM reading unit 420 in the first embodiment. In the similar manner to the first embodiment, explanation is given in which a logical-FBM reading unit 620-Li is generated corresponding to the value Li of the logical FBM division number.

As shown in FIG. 11, the logical-FBM reading unit 620-Li, first, counts the fail bit of the logical FBM 100-Li and determines whether all of bits are Pass (Step S41). When all of the bits are Pass (Yes at Step S41), "Null" is set to the pointer of the index No.=Li in the logical FBM index 450 and 0 is set to the number of the fail bits (Step S42), and the operation returns. In other words, the process of reading the logical FBM 100-Li into the logical-FBM storage memory area 332-Li is not performed.

When the logical FBM 100-Li includes 1 (Fail) (No at Step S41), the logical-FBM reading unit 620-Li reads the logical FBM 100-Li into the logical-FBM storage memory area 332-Li (Step S43) and sets the top address of the logical-FBM storage memory area 332-Li to the pointer of the index address No.=Li in the logical FBM index 450 and the counted count value to the number of the fail bits (Step S44), and the operation returns.

Figure 12:
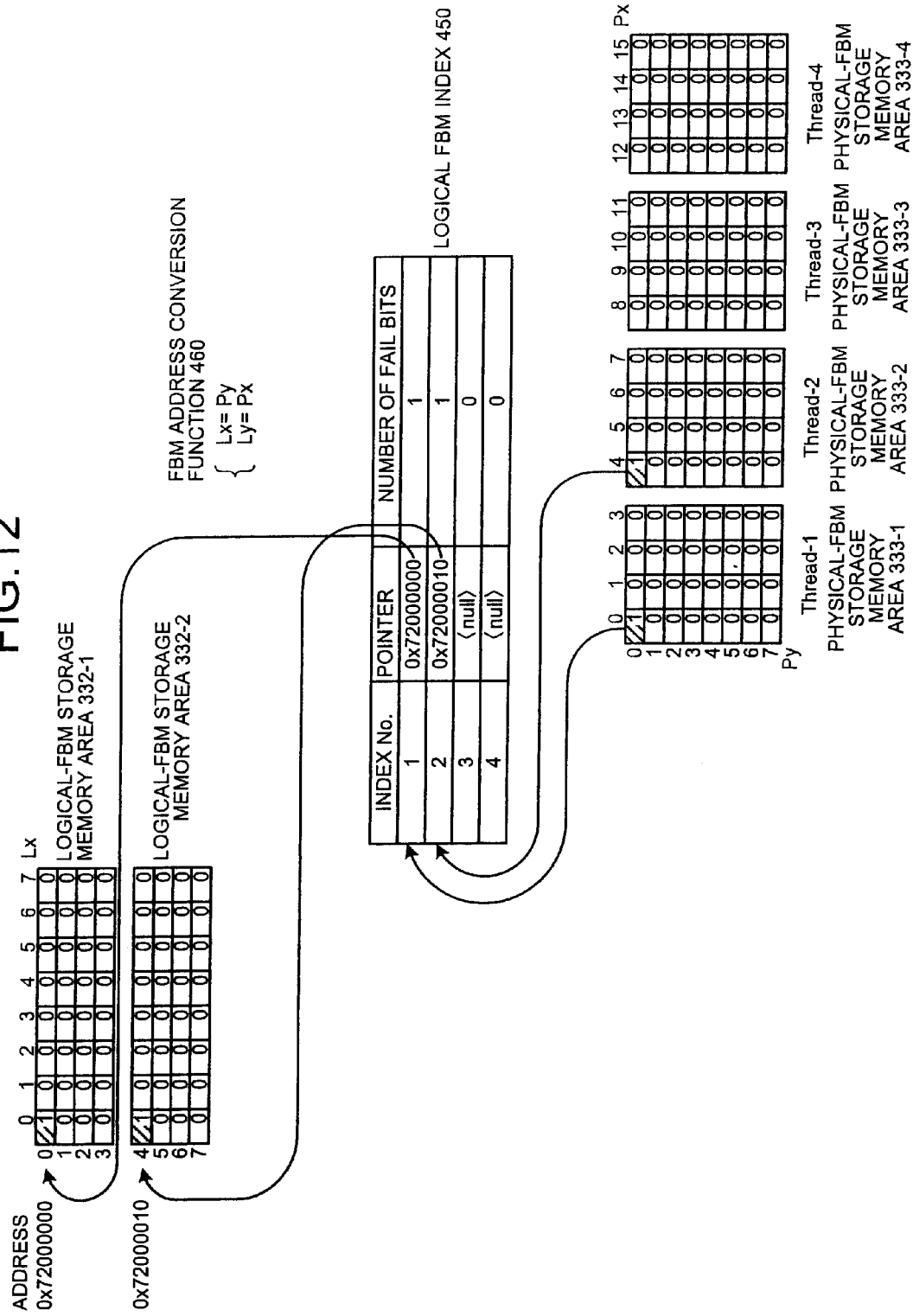
FIG. 12 is a diagram explaining a relationship between the logical FBM, the physical FBM, and the logical FBM index.

FIG. 12 is a diagram explaining a relationship between the logical FBM 100, the physical FBM 200, and the logical FBM index 450 in the second embodiment.

In FIG. 12, the physical-FBM storage memory area 333 is divided into four areas (the physical-FBM storage memory area 333-1 to the physical-FBM storage memory area 333-4) in the Px address direction, and the logical-FBM storage memory area 332 is also divided into four areas equally in the Ly direction; however, all of bits are Pass for the logical-FBM storage memory area 332-3 and the logical-FBM storage memory area 332-4, so that the areas are not secured. Moreover, the entries of the index No.=3 and the index No.=4 corresponding to the logical-FBM storage memory area 332-3 and the logical-FBM storage memory area 332-4, respectively, are included in the logical FBM index 450, however; the value of the pointer is "Null" and the number of the fail bits is 0 in each entry.

In this manner, according to the second embodiment, when the fail bit is not included in the divided logical FBM 100-Li, the reading process of this logical FBM 100-Li can be omitted, and the logical-FBM storage memory area 332-Li does not need to be secured, so that the processing speed can be improved and the memory usage can be reduced compared with the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A failure analysis method comprising:
securing a first memory in a main memory;
storing an electrical test result in which pass/fail information for respective memory cells of a semiconductor memory is arrayed in a logical address order that is an output order from a tester in secured first memory;
securing a plurality of second memory areas in each of which loading and storing of each data in a unit size is performed, in the main memory;
generating fail bit maps (FBMs) in which the pass/fail information is arrayed in a physical address order corresponding to a physical arrangement of the memory cells of the semiconductor memory based on different parts of the electrical test result stored in the first memory area, respectively;
storing the FBMs generated from the different parts of the electrical test result in the second memory areas, respectively; and
outputting the FBMs stored in the second memory areas, respectively.

2. The failure analysis method according to claim 1, wherein
the electrical test result is divided into a plurality of electrical test results,
the securing the first memory includes securing a plurality of the first memory areas, and
the storing the electrical test result in the first memory includes storing divided electrical test results in the first memory areas, respectively.

3. The failure analysis method according to claim 2, further comprising generating a logical FBM index in which number of pieces of fail information included in the divided electrical test results is described for each of the divided electrical test results, wherein
the generating the FBMs includes
specifying a physical address,
determining a logical address corresponding to specified physical address,
determining whether a divided electrical test result that includes the pass/fail information on determined logical address includes the fail information by referring to the logical FBM index, and
determining, when the divided electrical test result does not include the fail information, that the electrical test result specified by the determined logical address is a pass bit, and reading out, when the divided electrical test result includes the fail information, the pass/fail information on the electrical test result specified by the determined logical address from the first memory area.

4. The failure analysis method according to claim 3, wherein
the storing the electrical test result in the first memory area includes
storing the divided electrical test result that includes the fail information in the first memory area among the divided electrical test results, and
avoiding storing the divided electrical test result that does not include the fail information in the first memory area among the divided electrical test results.

5. The failure analysis method according to claim 3, wherein the generating the logical FBM index includes counting the number of pieces of the fail information included in the divided electrical test results for each of the divided electrical test results.

6. The failure analysis method according to claim 4, wherein the generating the logical FBM index includes counting the number of pieces of the fail information included in the divided electrical test results for each of the divided electrical test results.

7. A failure analysis apparatus that generates a fail bit map (FBM) in which pass/fail information for respective memory cells of a semiconductor memory is arrayed in a physical address order corresponding to a physical arrangement of the memory cells of the semiconductor memory based on an electrical test result in which the pass/fail information is arrayed in a logical address order that is an output order from a tester, the apparatus comprising:
a main memory in which, when writing of data is performed, loading and storing is performed with respect to data in a predetermined unit size including data stored in a memory address of a write destination; and
a plurality of operation units that generates FBMs based on different parts of the electrical test result input from outside, respectively, wherein
the operation units each include
a reading unit that secures a first memory area in the main memory and stores the electrical test result input from the outside into secured first memory area, and
an FBM converting unit that secures a second memory area in which loading and storing of each data in a unit size is performed, in the main memory, sequentially refers to the pass/fail information on each memory cell that is included in a part that a local operation unit takes charge of in the electrical test result stored in the first memory area and is stored in the logical address order, and sequentially writes referred pass/fail information in a memory address of secured second memory area corresponding to a physical address corresponding to a logical address of the referred pass/fail information, and
an array of the pass/fail information written in each of the second memory areas is output as the FBM for each of a plurality of parts of the electrical test result.

8. The failure analysis apparatus according to claim 7, wherein
the electrical test result is divided into a plurality of pieces,
each of the reading units individually secures the first memory area that stores one piece among the pieces of the electrical test result in the main memory, and generates a logical FBM index in which a top address of secured first memory area is associated with an identifier for identifying the piece of the electrical test result stored in the first memory area, and
each of the FBM converting units specifies a memory address of the first memory area in which a part that a local operation unit takes charge of in the electrical test result is stored in the main memory by referring to the logical FBM index.

9. The failure analysis apparatus according to claim 7, wherein
the electrical test result is divided into a plurality of pieces,
each of the reading units counts fail information included in one piece among the pieces of the electrical test result and individually secures the first memory area that stores the piece of the electrical test result, and generates a logical FBM index in which a top address of secured first memory area and a count value of the fail information are associated with an identifier for identifying the piece of the electrical test result stored in the first memory area, and each of the FBM converting units determines whether a piece that includes the fail information is stored in the first memory area in which a part that a local operation unit takes charge of is stored among the first memory areas based on the count value described in the logical FBM index, and, when the piece that includes the fail information is stored, specifies a memory address of the first memory area in which the part that the local operation unit takes charge of is stored based on the top address described in the logical FBM index.

10. The failure analysis apparatus according to claim 9, wherein each of the reading units determines whether the count value of the fail information that is included in the piece of the electrical test result is zero value, secures the first memory area for storing the piece when the count value is not zero value, and avoids securing the first memory area when the count value is zero value.

11. A computer program product that is executed by a computer that includes a plurality of operation units and a main memory in which, when writing of data is performed, loading and storing is performed with respect to data in a predetermined unit size including data stored in a memory address of a write destination, and causes the computer to perform generating a fail bit map (FBM) in which pass/fail information for respective memory cells of a semiconductor memory is arrayed in a physical address order corresponding to a physical arrangement of the memory cells of the semiconductor memory based on an electrical test result in which the pass/fail information is arrayed in a logical address order that is an output order from a tester, the computer program product causing the computer to perform:

generating a reading thread that secures a first memory area in the main memory and stores the electrical test result input from outside into secured first memory area; and generating a plurality of FBM converting-and-outputting threads that is performed by the operation units for generating FBMs based on different parts of the electrical test result, respectively, each of the FBM converting-and-outputting threads securing a second memory area in which loading and storing of each data in a unit size is performed, in the main memory, sequentially referring to the pass/fail information on each memory cell that is included in a part that a local thread takes charge of in the electrical test result stored in the first memory area and is stored in the logical address order, sequentially writing referred pass/fail information in a memory address of secured second memory area corresponding to a physical address corresponding to a logical address of the referred pass/fail information, and outputting an array of the pass/fail information written in the second memory area as the FBM for the part that the local thread takes charge of in the electrical test result.

12. The computer program product according to claim 11, wherein the electrical test result is divided into a plurality of pieces,
a plurality of the reading threads is generated,
each of generated reading threads individually secures the first memory area that stores one piece among the pieces of the electrical test result in the main memory, and generates a logical FBM index in which a top address of secured first memory area is associated with an identifier for identifying the piece of the electrical test result stored in the first memory area, and each of the FBM converting-and-outputting threads specifies a memory address of the first memory area in which a part that a local FBM converting-and-outputting thread takes charge of in the electrical test result is stored in the main memory by referring to the logical FBM index.

13. The computer program product according to claim 11, wherein the electrical test result is divided into a plurality of pieces,
a plurality of the reading threads is generated,
each of generated reading threads counts fail information included in one piece among the pieces of the electrical test result and individually secures the first memory area that stores the piece of the electrical test result, and generates a logical FBM index in which a top address of secured first memory area and a count value of the fail information are associated with an identifier for identifying the piece of the electrical test result stored in the first memory area, and each of the FBM converting-and-outputting threads determines whether a piece that includes the fail information is stored in the first memory area in which a part that a local FBM converting-and-outputting thread takes charge of is stored among the first memory areas based on the count value described in the logical FBM index, and, when the piece that includes the fail information is stored, specifies a memory address of the first memory area in which the part that the local FBM converting-and-outputting thread takes charge of is stored based on the top address described in the logical FBM index.

14. The computer program product according to claim 13, wherein each of generated reading threads determines whether the count value of the fail information that is included in the piece of the electrical test result is zero value, secures the first memory area for storing the piece when the count value is not zero value, and avoids securing the first memory area when the count value is zero value.

* * * * *